(12) United States Patent
Niwa et al.

(10) Patent No.: US 10,720,746 B2
(45) Date of Patent: Jul. 21, 2020

(54) OPTICAL ELEMENT AND METHOD FOR MANUFACTURING OPTICAL ELEMENT

(71) Applicant: NGK INSULATORS, LTD., Nagoya-Shi (JP)

(72) Inventors: Kousuke Niwa, Nagoya (JP); Jungo Kondou, Nagoya (JP); Shoichiro Yamaguchi, Nagoya (JP); Keiichiro Asai, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 16/427,842

(22) Filed: May 31, 2019

(65) Prior Publication Data

US 2019/0288473 A1    Sep. 19, 2019

Related U.S. Application Data

(63) Continuation of application No. PCT/JP2017/035625, filed on Sep. 29, 2017.

(30) Foreign Application Priority Data

Dec. 2, 2016 (JP) .................................. 2016-235394

(51) Int. Cl.
*G02B 6/122* (2006.01)
*H01S 3/03* (2006.01)
(Continued)

(52) U.S. Cl.
CPC .............. *H01S 3/0315* (2013.01); *G02B 5/18* (2013.01); *G02B 6/0016* (2013.01); *G02B 6/122* (2013.01);
(Continued)

(58) Field of Classification Search
CPC ........ G02B 5/18; G02B 6/0016; G02B 6/122; G02B 6/124; H01S 3/0085; H01S 3/0315; H01S 5/022
See application file for complete search history.

(56) References Cited

U.S. PATENT DOCUMENTS 9,859,684 B2 * 1/2018 Kondo ................. G02B 5/1814
2008/0225391 A1   9/2008 Walter et al.
(Continued)

FOREIGN PATENT DOCUMENTS

JP    2005-099099 A1    4/2005
JP    2008-070867 A1    3/2008
(Continued)

OTHER PUBLICATIONS

International Search Report and Written Opinion (Application No. PCT/JP2017/035625) dated Dec. 26, 2017.
(Continued)

*Primary Examiner* — Daniel Petkovsek
(74) *Attorney, Agent, or Firm* — Burr & Brown, PLLC

(57) ABSTRACT

An optical element includes an optical waveguide layer. The optical waveguide includes a periodic structure of grooves. The optical waveguide layer has a layer-thickness equal to or greater than 1.5 μm and is made of material selected from a group consisting of Ta2O5, Al2O3, LiNbO3, LiTaO3, AlN, GaN, SiC, and Yttrium aluminum garnet (YAG). (D/0.5Λ)≥2.5 is satisfied where D indicates the depth of groove; and Λ indicates the pitch of the arranged grooves in the periodic structure. The unit of Λ is identical to the unit of D.

26 Claims, 8 Drawing Sheets

(51) Int. Cl.
*F21V 8/00* (2006.01)
*H01S 3/00* (2006.01)
*G02B 5/18* (2006.01)
*H01S 5/022* (2006.01)
*G02B 6/124* (2006.01)

(52) U.S. Cl.
CPC ............ *G02B 6/124* (2013.01); *H01S 3/0085* (2013.01); *H01S 5/022* (2013.01)

(56) References Cited

U.S. PATENT DOCUMENTS

| | | | |
|---|---|---|---|
| 2012/0099611 A1* | 4/2012 | Kim | H01S 5/141 372/20 |
| 2014/0080729 A1* | 3/2014 | Grego | G01N 21/05 506/9 |
| 2015/0147020 A1* | 5/2015 | Kondo | G02B 6/124 385/10 |
| 2015/0288140 A1 | 10/2015 | Davies et al. | |
| 2016/0313145 A1* | 10/2016 | Kondo | G02B 6/124 |
| 2017/0047711 A1* | 2/2017 | Kondo | G02B 6/42 |
| 2017/0343708 A1 | 11/2017 | Niwa et al. | |
| 2017/0345952 A1* | 11/2017 | Yashiki | H01L 31/1075 |

FOREIGN PATENT DOCUMENTS

| | | |
|---|---|---|
| JP | 2008-299084 A1 | 12/2008 |
| JP | 2015-135931 A1 | 7/2015 |
| JP | 2015-535143 A1 | 12/2015 |
| WO | 2016/133161 A1 | 8/2016 |

OTHER PUBLICATIONS

English translation of International Preliminary Report on Patentability (Chapter I) (Application No. PCT/JP2017/035625) dated Jun. 13, 2019.

* cited by examiner

OPTICAL ELEMENT AND METHOD FOR MANUFACTURING OPTICAL ELEMENT

CROSS REFERENCE TO RELATED APPLICATION

The is a continuation of PCT International Application PCT/JP2017/035625 filed on Sep. 29, 2017, which claims a priority of Japanese Patent Application No. 2016-235394 filed on Dec. 2, 2016. The disclosures of these applications including the specifications, the drawings, and the claims are hereby incorporated by reference in its entirety.

FIELD OF THE INVENTION

The present disclosure is directed to an optical element and a method of producing the same.

BACKGROUND OF THE INVENTION

International publication No. 2016/133161 (hereinafter referred to as a Patent Literature 1) discloses, in order to etch an optical material layer with hard-processing property, providing a base layer between a resin layer and the optical material layer, forming an opening at the resin layer using a nanoimprint technique, etching the base layer through the opening at the resin layer, and etching the optical material layer through the opening at the base layer formed by the etching, so that a deeper recess is formed in the optical material layer.

SUMMARY OF THE INVENTION

In a case where an optical waveguide layer consists of hard-etching material, forming deep grooves in the optical waveguide layer would be, first of all, difficult. In Patent Literature 1, a periodic structure of shallow grooves is formed in a thin layer of the optical waveguide layer. However, in its working example, grooves were formed only up to 100 nm in the optical material layer made of $Ta_2O_5$. Note that, para. 0041 of the Patent Literature 1 describes that the optical material layer has a layer-thickness of 0.5 to 3 μm, but this is directed for a wide range of metal oxides listed in para. 0039 of the same literature and is not necessarily directed for material with highly hard-etching property.

In a case where shallow grooves are formed in a thin layer of the optical waveguide layer made of hard-etching material, there would be a problem that optical characteristics obtained from a given number of grooves, e.g. diffraction efficiency would be lowered. As a result, increased number of grooves may be required for obtaining desired optical characteristics and, in turn, the size of the optical element may be larger.

In view of the above-described non-limiting technical challenge, the present inventors have newly identified a value of realizing an optical characteristic based on a periodic structure of an optical waveguide layer of an optical element while reducing the number of grooves in the periodic structure of the optical waveguide layer.

An optical element according to an aspect of the present disclosure may be an optical element comprising an optical waveguide layer, the optical waveguide including a periodic structure of grooves, wherein the optical waveguide layer has a layer-thickness equal to or greater than 1.5 μm and is made of material selected from a group consisting of $Ta_2O_5$, $Al_2O_3$, $LiNbO_3$, $LiTaO_3$, AlN, GaN, SiC, and Yttrium aluminum garnet (YAG), and wherein (D/0.5Λ)≥2.5 is satisfied where D indicates the depth of groove; and Λ indicates the pitch of the arranged grooves in the periodic structure, the unit of Λ being identical to the unit of D.

In the present specification, (D/0.5Λ) is referred to as an aspect ratio. In the optical element according to an aspect of the present disclosure, unlike the prior approach, the optical waveguide layer has a layer-thickness equal to or greater than 1.5 μm, and a periodic structure of grooves with aspect ratio of 2.5 or greater and/or depth of 200 nm or greater is formed in the optical waveguide layer. Increase in the layer-thickness of the optical waveguide layer allows increase in the aspect ratio and/or groove depth, so that optical characteristic, e.g. diffraction efficiency obtained by the given number of grooves would be enhanced, thereby reducing the number of grooves and downsizing the optical element.

In a case of working example 1 of Patent Literature 1, pitch Λ (which is equal to an interval of arranged grooves) is 200 nm, and a depth D of groove is 100 nm. In this case, D/0.5Λ=1 is satisfied.

Layer-thickness of various layers such as the optical waveguide layer presented in the present specification would be determined based on observation of cross-section of layer using a scanning electron microscope. In particular, for measuring a thickness of a particular layer of a given product, one should basically use a scanning electron microscope FE-SEM (model JSM-7401F) produced by JEOL. If it is impossible by all means to commercially obtain this scanning electron microscope, then use of equivalent other scanning electron microscopes would be allowed.

In some embodiments, the pitch Λ of the arranged grooves in the periodic structure is equal to or greater than 150 nm.

In some embodiments, the pitch Λ of the arranged grooves in the periodic structure is equal to or less than 480 nm.

In some embodiments, the pitch Λ of the arranged grooves in the periodic structure is in the range from 150 nm to 470 nm.

In some embodiments, the pitch Λ of the arranged grooves in the periodic structure is in the range from 167 nm to 435 nm.

In some embodiments, the pitch Λ of the arranged grooves in the periodic structure is in the range from 175 nm to 380 nm.

In some embodiments, the depth D of the groove in the periodic structure is equal to or greater than 200 nm.

In some embodiments, the depth D of the groove in the periodic structure is equal to or greater than 250 nm.

In some embodiments, the depth D of the groove in the periodic structure is equal to or greater than 300 nm.

In some embodiments, the depth D of the groove in the periodic structure is equal to or less than 600 nm.

In some embodiments, the depth D of the groove in the periodic structure is equal to or less than 550 nm.

In some embodiments, the depth D of the groove in the periodic structure is equal to or less than 500 nm.

In some embodiments, L≤100 μm is satisfied where L indicates an effective length of the periodic structure. Depending to embodiments, the effective length of the periodic structure satisfies: L≤90 μm, L≤80 μm, L≤70 μm, L≤60 μm, L≤50 μm, L≤40 μm, L≤30 μm, L≤20 μm, L≤15 μm, or L≤10 μm.

In some embodiments, 4.5 µm≤L≤70.5 µm is satisfied where L indicates an effective length of the periodic structure.

In some embodiments, 5.01 µm≤L≤65.25 µm is satisfied where L indicates an effective length of the periodic structure.

In some embodiments, 5.25 µm≤L≤57 µm is satisfied where L indicates an effective length of the periodic structure.

The effective length of the periodic structure of grooves would be understood from a viewpoint of exertion of optical characteristic based on the periodic structure. For example, in a case where non-groove arrangement region is disposed at an intermediate region between periodic structures of grooves along the groove arrangement direction, this non-groove arrangement region is not regarded as a part of the effective length of the periodic structure of grooves. The effective length of the periodic structure of grooves may be measured excluding the size of the non-groove arrangement region.

In some embodiments, the number of grooves in the periodic structure is equal to or less than 200.

In some embodiments, the groove in the periodic structure is defined by a pair of side surfaces opposed substantially in parallel and a bottom surface arranged between the side surfaces.

In some embodiments, θ≥80°, or θ≥82°, or θ≥84°, or θ≥86°, or θ≥88° is satisfied where θ indicates an angle between the bottom surface and the side surface of the groove in the periodic structure.

In some embodiments, average pitch tolerance of the grooves in the periodic structure is within ±0.5 nm.

In some embodiments, the optical waveguide layer comprises a ridge-shaped portion provided with the periodic structure extending along the groove arrangement direction in the periodic structure.

A laser assembly according to another aspect of the present disclosure may be a laser assembly comprising:
an optical element of any one or any combination of above-describes ones; and
a laser element including an active layer optically coupled with the optical waveguide layer of the optical element.

A method of producing an optical element according to an aspect of the present disclosure may comprises:
forming a first mask layer onto an optical waveguide layer, the optical waveguide layer having a layer-thickness equal to or greater than 1.5 µm and being made of material selected from a group consisting of $Ta_2O_5$, $Al_2O_3$, $LiNbO_3$, $LiTaO_3$, AlN, GaN, SiC, and Yttrium aluminum garnet (YAG);
forming, on to the first mask layer, a second mask layer that is made of plastic material;
forming an arrangement of first openings in the second mask layer based on pressing a mold to the second mask layer and irradiating with an energy ray, the mold including a pressing surface provided with a periodic structure of walls where walls elongated in a first direction are arranged at a constant pitch along a second direction orthogonal to the first direction;
forming an arrangement of second openings in the first mask layer by dry-etching through the first openings in the second mask layer; and
forming a periodic structure of grooves in the optical waveguide layer by dry-etching through the second openings in the first mask layer, wherein (D/0.5Λ)≥2.5 is satisfied
where
D indicates the depth of groove in the periodic structure; and
Λ indicates the pitch of the arranged grooves in the periodic structure, the unit of Λ being identical to the unit of D.

The first opening is formed mainly by the second mask layer being pressed by the mold. Therefore, an embodiment is envisioned where a film of the second mask layer remains at the bottom of the first opening, and the first opening does not completely penetrate through the second mask layer. In some cases, such remaining film is removed through ashing process such as oxygen plasma or the like. In some cases, the dry-etching through the first openings may be performed while the film remains at the first opening.

In some embodiments, the above-described pitches Λ and groove depths D may be employed.

In some embodiments, the groove in the periodic structure is defined by a pair of side surfaces opposed substantially in parallel and a bottom surface arranged between the side surfaces, and wherein
θ≥80°, or θ≥82°, or θ≥84°, or θ≥86°, or θ≥88° is satisfied where θ indicates an angle between the bottom surface and the side surface of the groove.

In some embodiments, average pitch tolerance of the grooves in the periodic structure is within ±0.5 nm.

An aspect of the present disclosure may facilitate that an optical characteristic based on the periodic structure in the optical waveguide layer of the optical element is enhanced, while reducing the number of grooves in the periodic structure of the optical waveguide layer.

BRIEF DESCRIPTION OF THE DRAWINGS

Hereinafter, non-limiting exemplary embodiments and examples of the present invention will be described with reference to FIGS. 1 to 15.

FIG. 1 does not precisely scale the thicknesses of the silicon substrate and each element.

DETAILED DESCRIPTION OF THE INVENTION

Disclosed one or more embodiments and respective features included in the embodiments are not mutually exclusive. A skilled person would be able to combine respective embodiments and/or respective features without requiring excess descriptions, and would appreciate synergistic effects of such combinations. Overlapping descriptions among the embodiments would be basically omitted. Referenced drawings are prepared for the purpose of illustration of invention, and may possibly be simplified for the sake of convenience of illustration.

Figure 1:
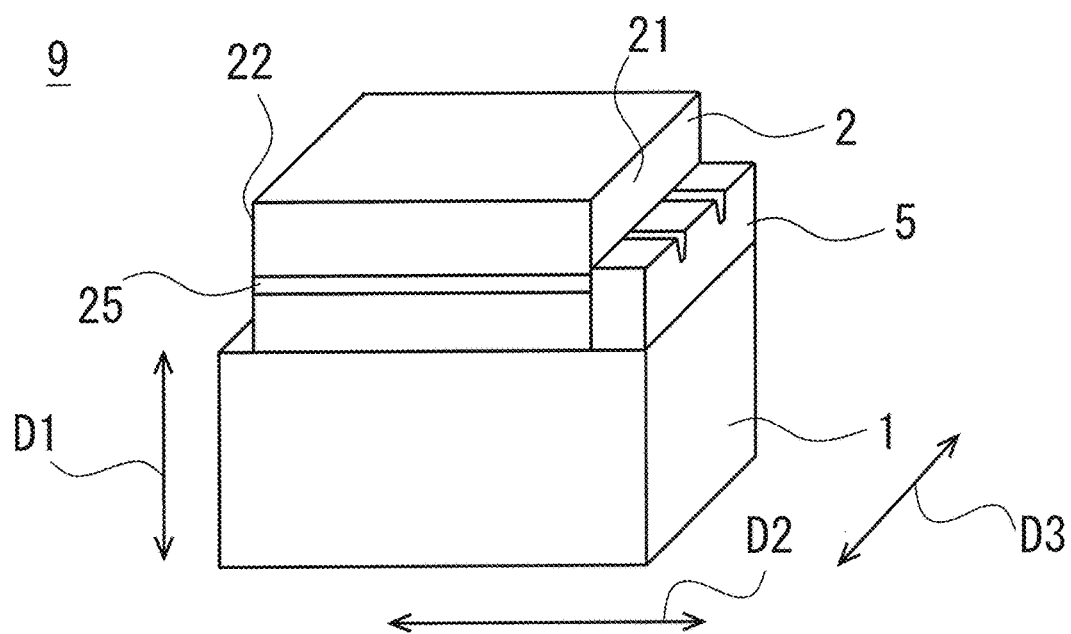
FIG. 1 is a schematic perspective view of a laser assembly according to an aspect of the present disclosure, showing a state where a semiconductor laser device and an optical element are mounted onto a silicon substrate.
Figure 2:
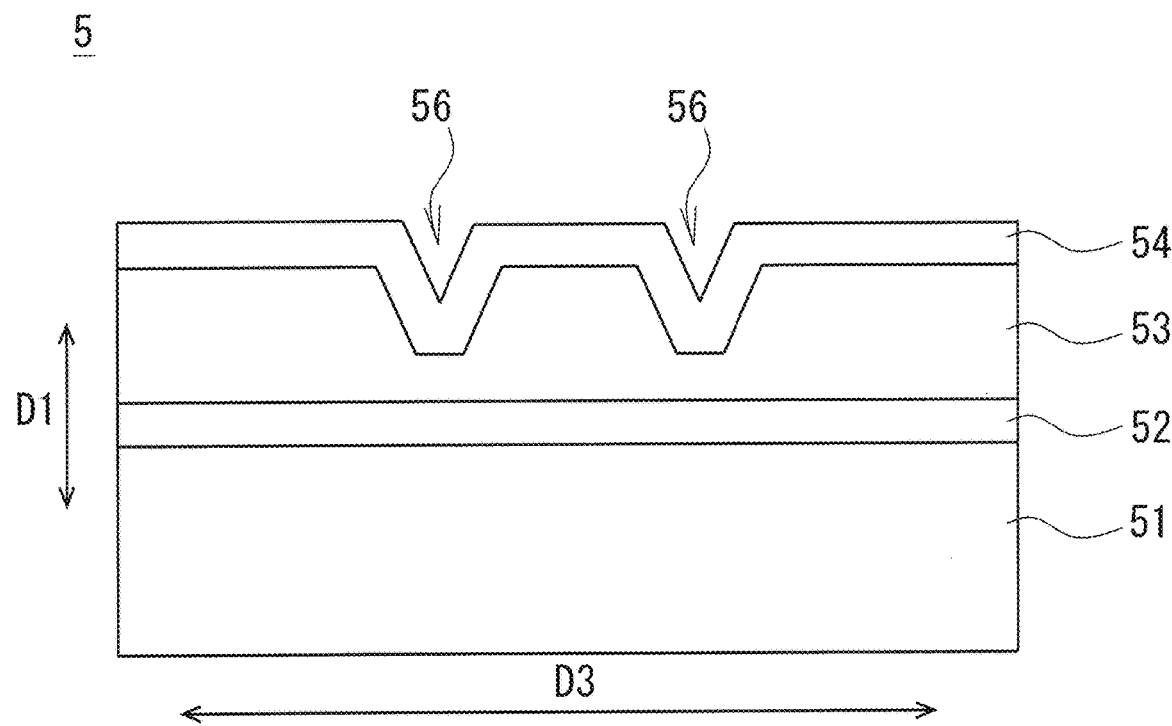
FIG. 2 is a schematic side view of one end face of an optical element according to an aspect of the present disclosure.
Figure 3:
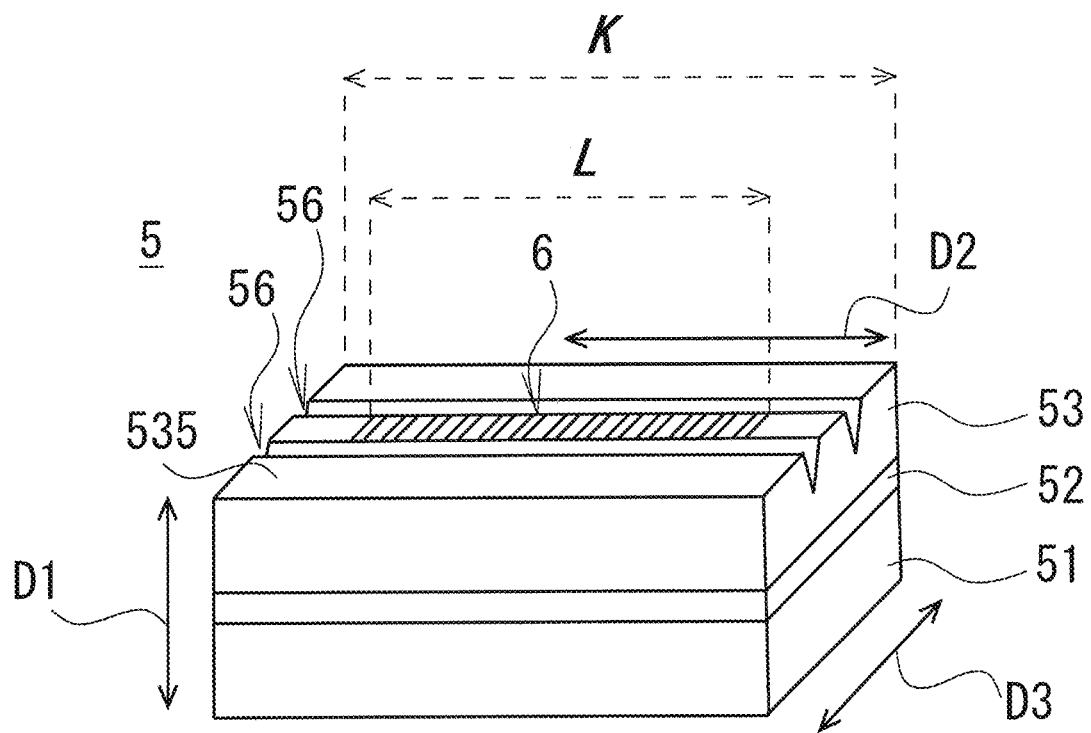
FIG. 3 is a schematic perspective view of an optical element according to an aspect of the present disclosure, showing that a periodic structure of grooves is provided on a main surface of an optical waveguide layer. Illustration of top clad layer of the optical element is omitted in FIG. 3.
Figure 4:
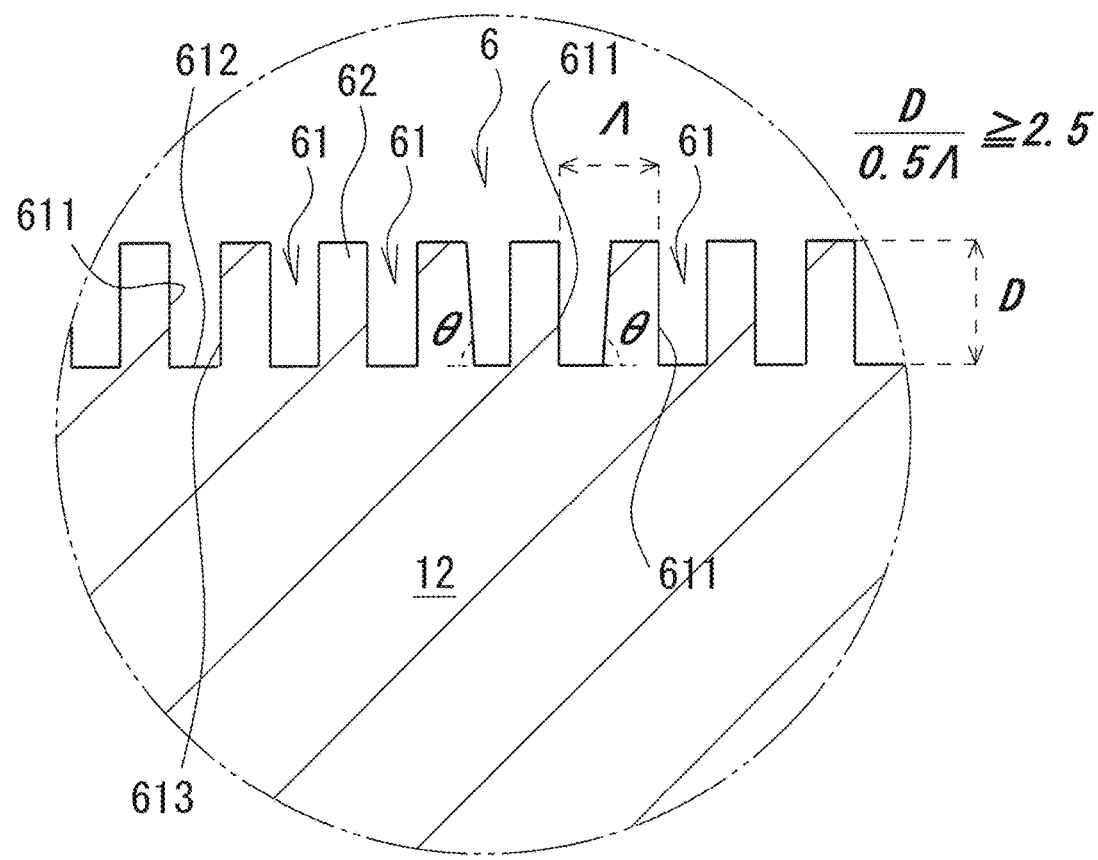
FIG. 4 is a partially expanded view of the periodic structure of grooves shown in FIG. 3, schematically illustrating pitch Λ, depth D of groove, and angle θ between bottom and side surfaces of groove.
Figure 5:
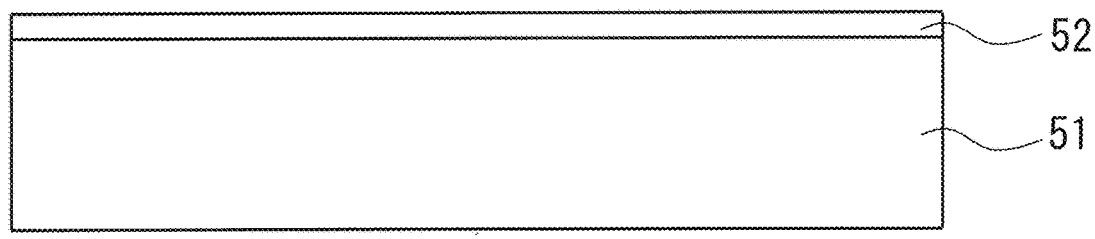
FIG. 5 is a process view of producing an optical element according to an aspect of the present disclosure, showing that a bottom clad layer is formed onto a base substrate.
Figure 6:
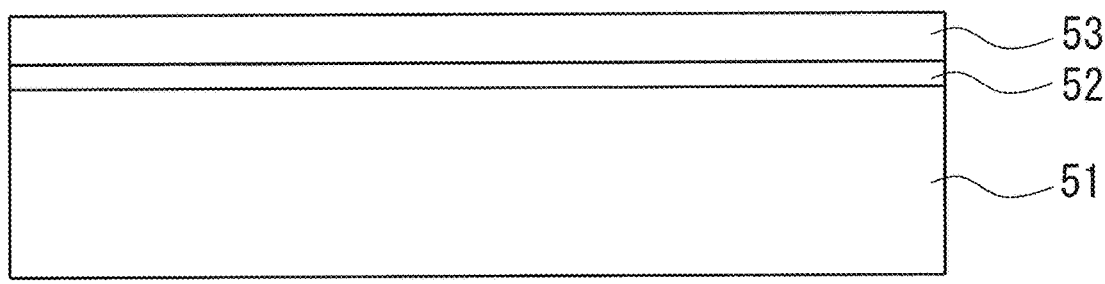
FIG. 6 is a process view of producing an optical element according to an aspect of the present disclosure, showing that an optical waveguide layer is formed onto the base layer via the bottom clad layer.
Figure 7:
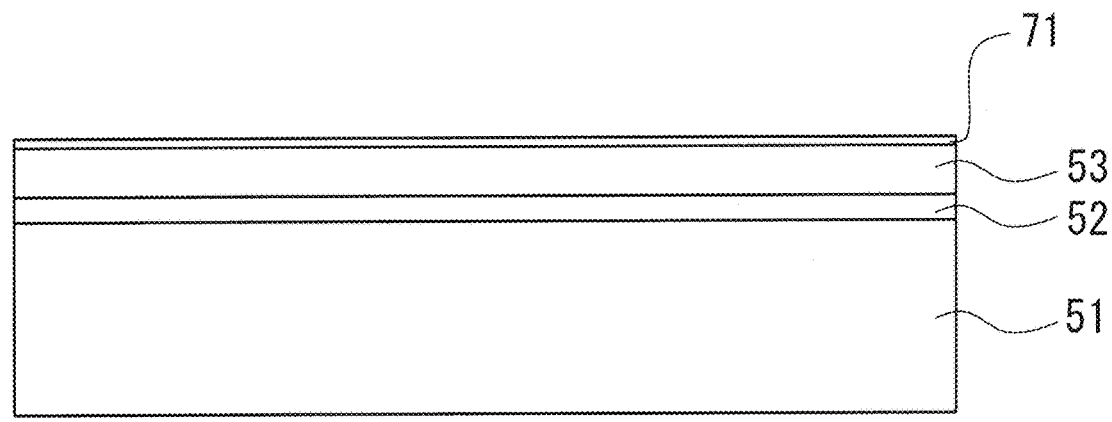
FIG. 7 is a process view of producing an optical element according to an aspect of the present disclosure, showing that a first mask layer is formed onto the base layer via the bottom clad layer and the optical waveguide layer.
Figure 8:
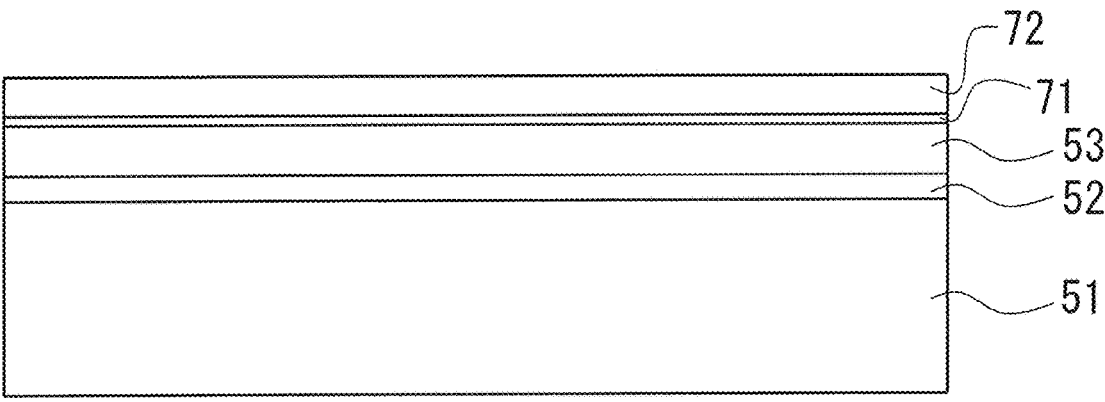
FIG. 8 is a process view of producing an optical element according to an aspect of the present disclosure, showing that a second mask layer made of plastic material is formed onto the base layer via the bottom clad layer, the optical waveguide layer, and the first mask layer.
Figure 9:
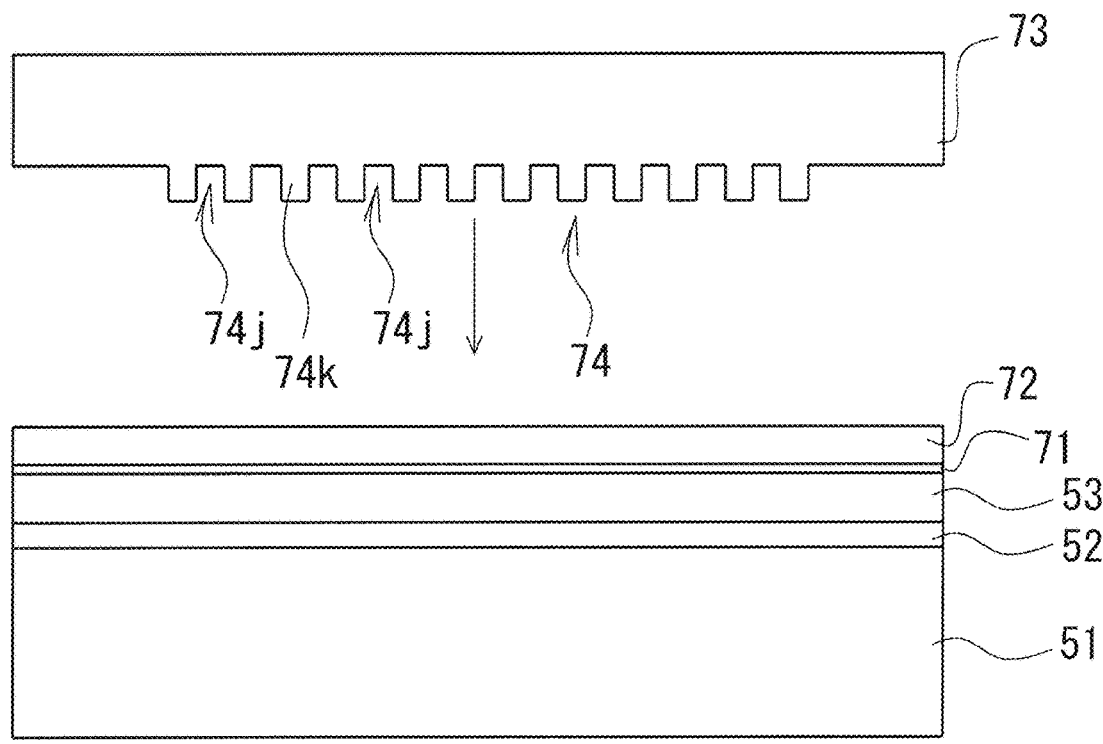
FIG. 9 is a process view of producing an optical element according to an aspect of the present disclosure, showing a state directly before the second mask layer is pressed by a mold having a pressing surface provided with a periodic structure of walls where walls extending in a first direction are arranged at constant pitch in a second direction orthogonal to a first direction.
Figure 10:
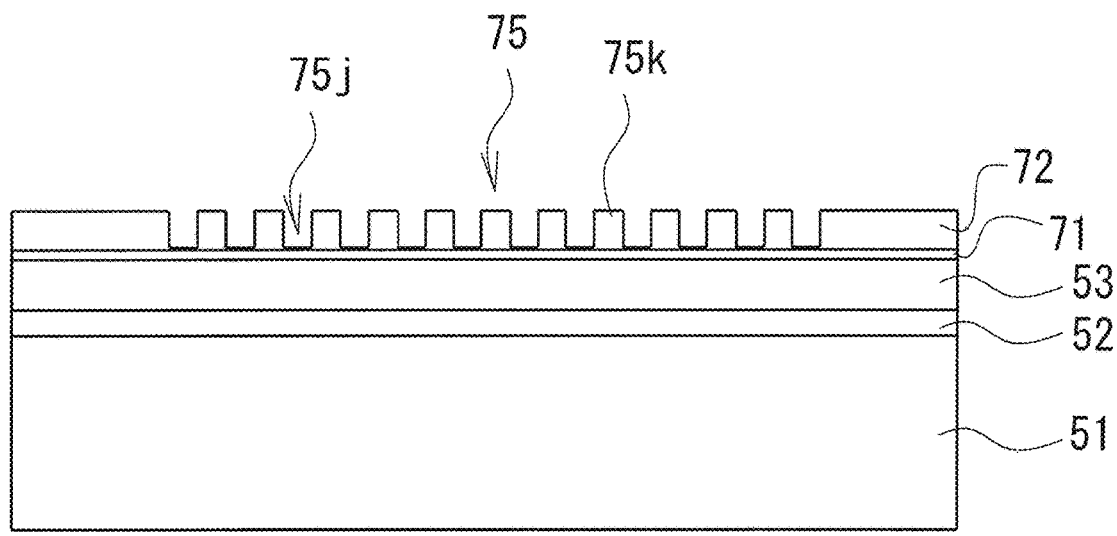
FIG. 10 is a process view of producing an optical element according to an aspect of the present disclosure, showing a state after the second mask layer is pressed by the mold.
Figure 11:
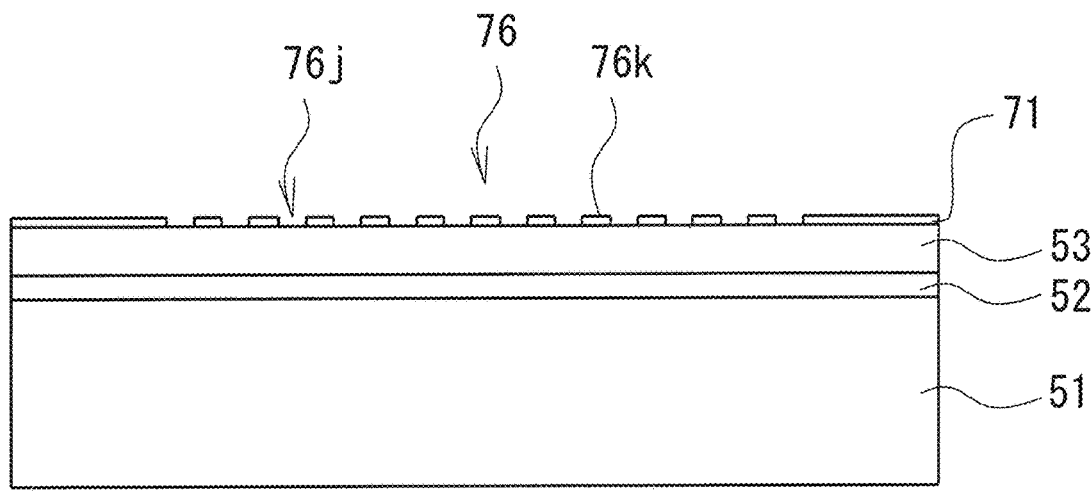
FIG. 11 is a process view of producing an optical element according to an aspect of the present disclosure, showing a state where arrangement of second openings are formed in the first mask layer through dry etching via first openings at the second mask layer.
Figure 12:
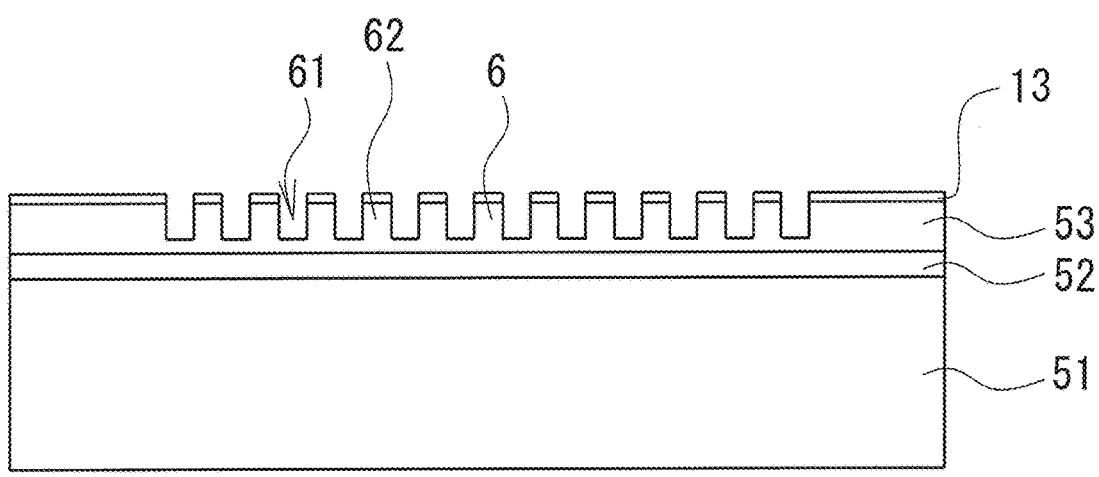
FIG. 12 is a process view of producing an optical element according to an aspect of the present disclosure, showing a state a periodic structure of grooves is formed in the optical waveguide layer through dry etching via the second openings at the first mask layer.
Figure 13:
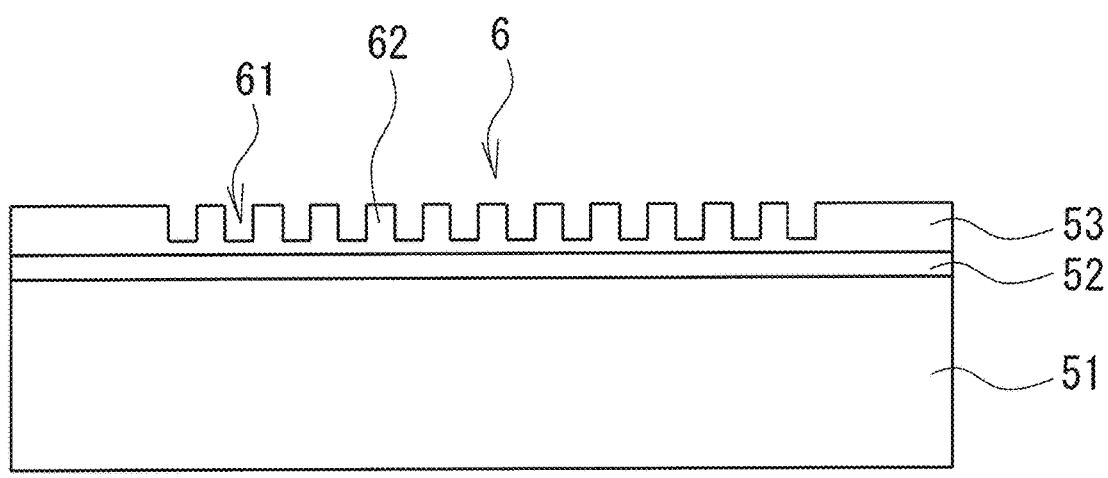
FIG. 13 is a process view of producing an optical element according to an aspect of the present disclosure, showing a state where the first mask layer is removed.
Figure 14:
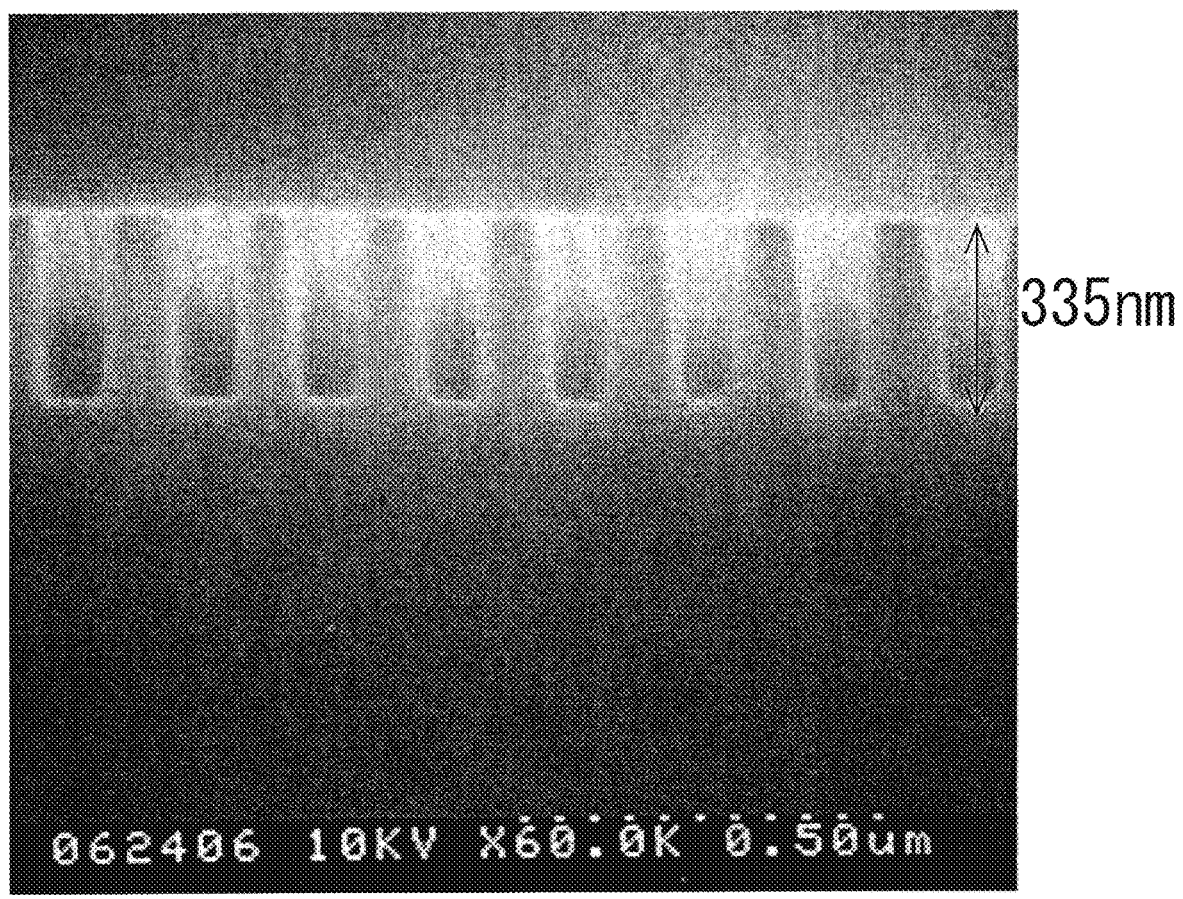
FIG. 14 is a cross-sectional SEM image of the optical waveguide layer of the optical element according to a working example 1.
Figure 15:
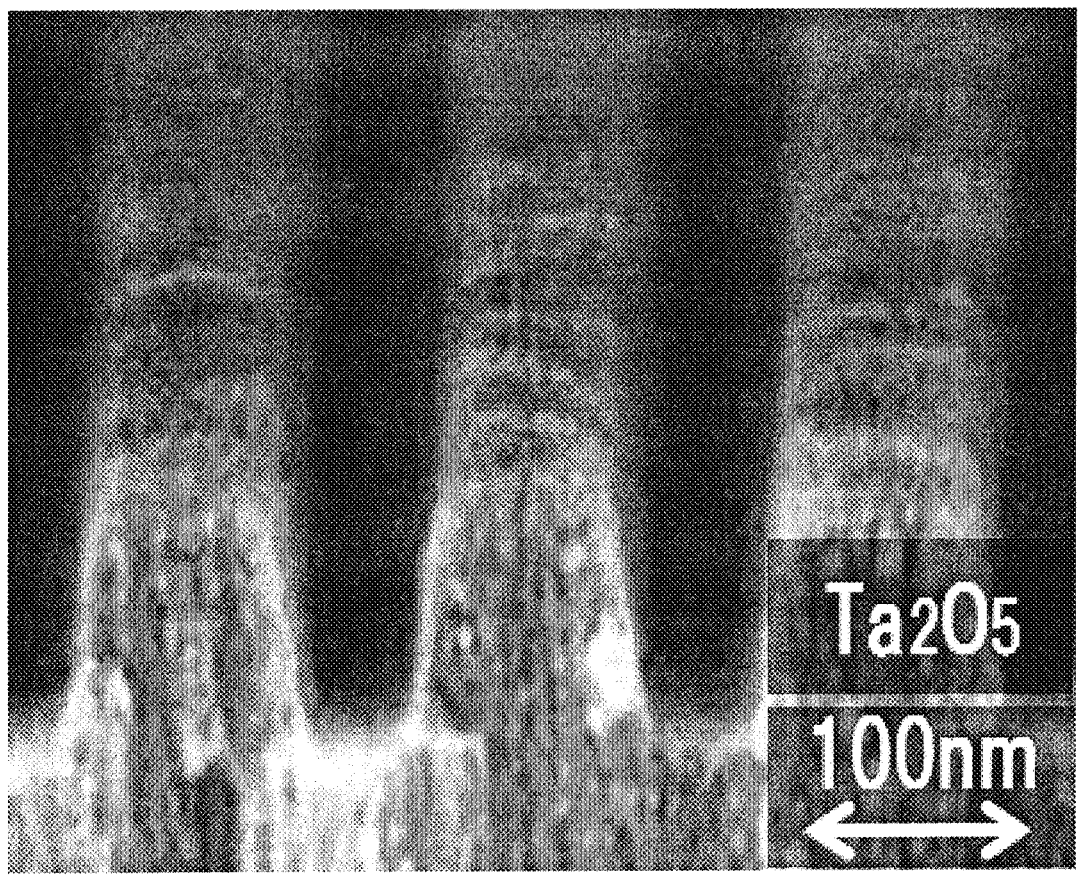
FIG. 15 is a cross-sectional SEM image of the optical waveguide layer of the optical element according to a comparative example 1.

FIG. 1 is a schematic perspective view of a laser assembly, showing a state where a semiconductor laser device and an optical element are mounted onto a silicon substrate. FIG. 1 does not precisely scale the thicknesses of the silicon substrate and each element. FIG. 2 is a schematic side view of one end face of an optical element. FIG. 3 is a schematic perspective view of an optical element, showing that a periodic structure of grooves is provided on a main surface of an optical waveguide layer. Illustration of top clad layer of the optical element is omitted in FIG. 3. FIG. 4 is a partially expanded view of the periodic structure of groove shown in FIG. 3, schematically illustrating pitch Λ, depth D of groove, and angle θ between bottom and side surfaces of groove. FIG. 5 is a process view of producing an optical element, showing that a bottom clad layer is formed onto a base substrate. FIG. 6 is a process view of producing an optical element, showing that an optical waveguide layer is formed onto the base layer via the bottom clad layer. FIG. 7 is a process view of producing an optical element, showing that a first mask layer is formed onto the base layer via the bottom clad layer and the optical waveguide layer. FIG. 8 is a process view of producing an optical element, showing that a second mask layer made of plastic material is formed onto the base layer via the bottom clad layer, the optical waveguide layer, and the first mask layer. FIG. 9 is a process view of producing an optical element, showing a state directly before the second mask layer is pressed by a mold having a pressing surface provided with a periodic structure of walls where walls extending in a first direction are arranged at constant pitch in a second direction orthogonal to a first direction. FIG. 10 is a process view of producing an optical element, showing a state after the second mask layer is pressed by the mold. FIG. 11 is a process view of producing an optical element, showing a state where arrangement of second openings are formed in the first mask layer through dry etching via first openings at the second mask layer. FIG. 12 is a process view of producing an optical element, showing a state a periodic structure of grooves is formed in the optical waveguide layer through dry etching via the second openings at the first mask layer. FIG. 13 is a process view of producing an optical element, showing a state where the first mask layer is removed. FIG. 14 is a cross-sectional SEM image of the optical waveguide layer of the optical element according to a working example 1. FIG. 15 is a cross-sectional SEM image of the optical waveguide layer of the optical element according to a comparative example 1.

FIG. 1 illustrates a laser assembly 9 which is one non-limiting application of an optical element 5 of the present disclosure. The laser assembly 9 has a mounting board 1 such as made of silicon (Si), a semiconductor laser device 2 mounted onto the mounting board 1, and an optical element 5 mounted onto the mounting board 1. As would be understood from the following descriptions, the optical element 5 includes an optical waveguide layer provided with a periodic structure of grooves. In one exemplary laser assembly 9, the periodic structure of the optical waveguide layer is used as a diffraction grating for returning, to the semiconductor laser device 2, an output light from the semiconductor laser device 2, thus facilitating stability of output light wavelength of the semiconductor laser device 2.

Types of the semiconductor laser device 2 would be various. In an example, Fabry-Perot laser device is used. In some cases, the semiconductor laser device 2 has an anti-reflection coating (AR coating) on its output end face, and does not oscillate by itself. A single resonator may be configured by such types of semiconductor laser device 2 and diffraction grating, thus stabilities of output-wavelength and output-power are enhanced.

A case is envisioned where a semiconductor laser device is used where a diffraction grating is not embedded in the laser element. Combination of such semiconductor laser device and an optical element of the present disclosure would allow a diffraction grating not to be embedded into the semiconductor laser device, and a stable single-wavelength light source can be produced with lesser monetary cost.

A case is envisioned where a semiconductor laser device is used which emits a laser light with a plurality of peak wavelengths. Combination of such semiconductor laser device and an optical element of the present disclosure would allow a longitudinal mode of laser oscillation to be shifted to a single-mode, enhancing stability and selectivity of peak wavelength.

Note that there is no limitation on the number of optical elements 5 to be associated with one semiconductor laser device 2. That is, two or more optical elements 5 may be optically coupled with one semiconductor laser device 2.

The plural optical elements 5 optically coupled with the common semiconductor laser device 2 may have the same or different configurations.

Further note that, in a case where the laser element 2 is an array of laser elements where each laser element 2 has a plurality of light emitting points, one optical element 5 is used for one array of laser elements or a plurality of optical elements 5 is used for the plurality of light emitting points.

A plurality of diffraction grating 6 may be formed in the optical element 5 associated with one semiconductor laser device 2. That is, two or more diffraction gratings 6 may be optically coupled with one semiconductor laser device 2. The plurality of diffraction gratings 6 optically coupled with the common semiconductor laser device 2 may have the same or different configurations in pitch, groove-depth, and the like.

In a case where the laser element 2 is an array of laser elements with a plurality of light emitting points, one optical element 5 is used corresponding to a plurality of laser elements, and a plurality of diffraction gratings 6 may be optically coupled thereto respectively in this optical element 5.

The semiconductor laser device 2 is a solid light source capable of emitting a laser light based on a current flowing between a pair of electrodes. The semiconductor laser device 2 has an active layer, top and bottom clad layers arranged to sandwich the active layer, a first electrode electrically coupled, e.g. in ohmic-contact with the top clad layer, and a second electrode electrically coupled with the bottom clad layer. The semiconductor laser device 2 has a light outputting end face 21 and a light reflecting end face 22. A laser resonator in the semiconductor laser device 2 is defined in the active layer of the semiconductor laser device 2 between the light outputting end face 21 and the light reflecting end face 22. In some cases, a high-reflection layer is formed onto the light reflecting end face 22, and a low-reflection layer is formed onto the light outputting end face 21.

Wavelength of laser light emitted from the semiconductor laser device 2 would be various, but may be in an infrared band or may belong to a near-infrared ray. In some cases, the wavelength of laser light is in a range of 750 nm to 1500 nm, a range of 750 nm to 1000 nm, a range of 750 nm to 900 nm. In a specific case, the wavelength of laser light is 800 nm. When the wavelength of laser light emitted from the semiconductor laser device 2 is in the near-infrared band, in the semiconductor laser device 2, oscillation wavelength of the semiconductor laser device 2 changes due to temperature dependency of bandgap of semiconductor material of the semiconductor laser device 2. The optical element 5 of the present disclosure is particularly advantageous for combination with such semiconductor laser device 2, not necessarily limited to this through. Note that, FIG. 1 schematically illustrates the active layer 25 of the semiconductor laser device 2 just for a reference.

Various known methods can be employed for optically coupling the semiconductor laser device 2 and the optical element 5. In some cases, the active layer 25 of the semiconductor laser device 2 and the optical waveguide layer of the optical element 5 are directly bonded (butt-joint). Optionally, an end face of the optical element 5 facing the light outputting end face 21 of the semiconductor laser device 2 is coated with an AR-coating layer (Anti-Reflection coating layer). An embodiment is also envisioned where AR-coating layers are formed onto the light outputting end face 21 of the semiconductor laser device 2 and the end face of the optical element 5 facing thereto so that a resonator of the semiconductor laser device 2 is extended to the optical element 5.

The non-limiting exemplary optical element 5 shown in FIG. 2 has a base substrate 51, a bottom clad layer 52 stacked onto the base substrate 51, an optical waveguide layer 53 stacked onto the base substrate 51 via the bottom clad layer 52, and a top clad layer 54 stacked onto the base substrate 51 via the bottom clad layer 52 and the optical waveguide layer 53.

The base substrate 51 may be a silicon substrate for example, but not necessarily limited to this and other various types of substrates can be used. The base substrate may be made of lithium niobate, lithium tantalate, AlN, SiC, ZnO, glass such as quartz glass, synthetic quartz and crystal, for example. In cases of glass such as quarts glass, synthetic quartz, crystal and silicon, they have better processing property.

The bottom clad layer 52 is silicon dioxide ($SiO_2$) for example, but not necessarily limited to this. Various material with a lower refractive index than that of the optical waveguide layer 53 may be used. The top clad layer 54 is silicon dioxide ($SiO_2$) for example, but not necessarily limited to this. Various material with a lower refractive index than that of the optical waveguide layer 53 may be used. Other than the silicon dioxide, tantalum oxide and zinc oxide can be named as examples of material for cladding layer. Dopant may be added to the cladding layer so as to regulate the refractive index of cladding layer. For example, P, B, Al and Ga can be indicated as a dopant.

The optical waveguide layer 53 consists of material selected from a group consisting of $Ta_2O_5$, $Al_2O_3$. $LiNbO_3$, $LiTaO_3$, AlN, GaN, SiC, and Yttrium aluminum garnet (YAG). Refractive index of the optical waveguide layer 53 is equal to or greater than 1.7, preferably equal to or greater than 2.0, in some cases. $\Lambda=\lambda/(2n*p)$ is satisfied, where $\Lambda$ indicates a pitch of arranged groove, $\lambda$ indicates a wavelength of laser light, n indicates a refractive index, and p indicates a diffraction order. When the optical waveguide layer 53 is $Ta_2O_5$, the refractive index n of the optical waveguide layer 53 satisfies n=2.105. When the wavelength of laser light is 800 nm and p=1, the pitch of arranged groove formed in the optical waveguide layer 53 would be $\Lambda$=about 190 nm. The optical waveguide layer 53 has a thickness equal to or greater than 1.5 µm. The maximum layer-thickness of the optical waveguide layer 53 is 5 µm in some cases.

The optical waveguide layer 53 may be doped with one or more metal elements selected from a group consisting of magnesium (Mg), zinc (Zn), scandium (Sc) and indium (In), thus the endurance against optical damage would be enhanced.

By using various thin-film forming technology available now or in future, the bottom clad layer 52, the optical waveguide layer 53 and the top clad layer 54 may be formed. Physical vapor deposition (PVD) or chemical vapor deposition (CVD) can be used. In most cases, sputtering is employed.

The optical waveguide layer 53 can be formed by thinning a base. In this case, the bottom clad layer 52 can be formed, through thin-film forming technology, onto one side of the thinned optical waveguide layer, and this can be bonded to the base substrate 51. Then, the top clad layer 54 can be formed onto the opposite side of the thinned optical waveguide layer through thin-film forming technology. As a method for bonding the bottom clad layer 52 to the base substrate 51, bonding via plastic material or low-melting glass or direct bonding at room temperature can be used.

As schematically illustrated in FIGS. 3 and 4, the optical waveguide layer 53 has a periodic structure 6 of grooves 61. The main surface 535 of the optical waveguide layer 53 is provided with the periodic structure 6 configured from an arrangement of grooves 61. The main surface indicates a flat surface that is orthogonal to a stacking direction D1 of respective layers in the optical element 5. In the periodic structure 6, the grooves 61 are arranged at a pitch Λ along the groove-arrangement direction D2. Each groove 61 has a depth D along the stacking direction D1. Each groove 61 extends in a lateral direction D3 that is orthogonal to the stacking direction D1 and the groove-arrangement direction D2.

Each groove 61 is defined by a pair of side surfaces 611, 613 facing one another in parallel substantially, and a bottom surface 612 that is arranged between the paired side surfaces 611, 613. In one groove 61, the first side surface 611 is positioned closer to a light-input side of the optical element 5, in other words, positioned closer to the semiconductor laser device 2. The second side surface 613 is positioned closer to a light-output side of the optical element 5, in other words, positioned farther from the semiconductor laser device 2. The bottom surface 612 is substantially orthogonal to the stacking direction D1. The respective side surfaces 611, 613 are substantially orthogonal to the groove-arrangement direction D2. Note that, the side surfaces 611, 613 and the bottom surface 612 extend in the lateral direction D3. Angle between the first side surface 611 and the bottom surface 612 and angle between the second side surface 613 and the bottom surface 612 are illustrated.

Walls 62 are formed between adjacent grooves 61 in the groove-arrangement direction D2. The wall 61 has a height that is equal to or close to the depth of groove 61. The wall 62 extends in the lateral direction D3 and is substantially orthogonal to the groove-arrangement direction D2.

The pitch Λ is equal to an interval of arranged grooves in the groove-arrangement direction D2. The pitch Λ is equal to an interspace between the first side surface 611 of a first groove and the first side surface 611 of a second groove that is arranged adjacent to the first groove in the groove-arrangement direction D2, and/or an interspace between the second side surface 613 of a first groove and the second side surface 613 of a second groove that is arranged adjacent to the first groove in the groove-arrangement direction D2.

The periodic structure 6 is used as a diffraction grating, and the pitch Λ of the arranged grooves in the periodic structure 6 is determined in accordance with a wavelength of laser light to be diffracted. As described above, the refractive index of the optical waveguide layer 53 is equal to or greater than 1.7, preferably equal to or greater than 2.0 in some cases. When the optical waveguide layer 53 is $Ta_2O_5$, the refractive index n of the optical waveguide layer 53 satisfies n=2.105. The narrowed pitch arrangement of grooves in the groove-arrangement direction D2 would ensure sufficient number of grooves within a shorter distance.

In some embodiments, the pitch Λ of the arranged grooves of the periodic structure 6 is equal to or greater than 150 nm and/or equal to or less than 480 nm. In some cases, the pitch Λ of the arranged grooves of the periodic structure 6 is equal to or greater than 150 nm and equal to or less than 470 nm, or equal to or greater than 167 nm and equal to or less than 435, or equal to or greater than 175 nm and equal to or less than 380. Dependent to embodiments, the pitch Λ may be equal to or greater than 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 310 nm, 320 nm, 330 nm, 340 nm, 350 nm, 400 nm or 450 nm. Dependent to embodiments, the pitch Λ may be equal to or less than 470 nm, 460 nm, 450 nm, 400 nm, 350 nm, 300 nm, 250 nm or 200 nm.

Any combinations of the lowest and highest values of the above-described pitches are clearly supported by the present specification. As a numerical range of pitch Λ, various combinations would be understandable such as 150 nm to 480 nm, 150 nm to 470 nm, 160 nm to 460 nm, 180 nm to 250 nm and the like. All combinations of the lowest and highest values of the pitch are not listed here, but are substantially disclosed herein. In a specific embodiment, the pitch Λ is 185 nm±0.5 nm, or 239 nm±0.5 nm.

The pitch of the arranged grooves in the periodic structure would suffer fluctuation from various factors, i.e. tolerance or variation is caused in the pitch. Pitch tolerance indicates a difference between a target constant value of pitch and a measurement of pitch. In some cases, an averaged pitch tolerance that is an average of pitch tolerances is equal to or less than ±05 nm.

In the present embodiment, the optical waveguide layer 53 consisting of a material selected from a group consisting of $Ta_2O_5$, $Al_2O_3$, $LiNbO_3$, $LiTaO_3$, AlN, GaN, SiC, and Yttrium aluminum garnet (YAG) has a layer-thickness that is equal to or greater than 1.5 μm. Furthermore, $D/0.5Λ≥2.5$ is satisfied where D indicates a depth of groove of periodic structure, Λ indicates pitch, and the unit of D and the unit of Λ are the same.

In the present embodiment, the optical waveguide layer 53 has a thickness of 1.5 μm or more, and a periodic structure of grooves with an aspect ratio of 2.5 or more and/or a depth of 200 nm or more is formed in the optical waveguide layer 53. Increase of the layer-thickness of the optical waveguide layer 53 allows aspect ratio and/or depth of groove 61 to be greater and allows the optical characteristics, e.g. diffraction efficiency, obtained from the given number of grooves 61 to be enhanced so that the number of grooves 61 can be reduced and the optical element can be downsized.

Dependent to embodiments, the aspect ratio is equal to or greater than 3, 3.5, 4, 5, or 5.5. Dependent to embodiments, similar result may be obtained by setting the depth of groove at 200 nm even the aspect ratio is 2.5 or less.

Under the same pitch Λ, if the depth D of groove 61 is increased, then the aspect ratio will also be increased. However, it is first of all difficult to form a deeper groove in the optical waveguide layer 53 consisting of a material selected from a group consisting of $Ta_2O_5$, $Al_2O_3$, $LiNbO_3$, $LiTaO_3$, AlN, GaN, SiC, and Yttrium aluminum garnet (YAG), and thus there may be an upper limit for the aspect ratio. In some embodiments, $2.5≤D/0.5Λ≤6$ is satisfied.

In a case where the optical waveguide layer 53 is made of a material selected from a group consisting of $Ta_2O_5$, $Al_2O_3$, $LiNbO_3$, $LiTaO_3$, AlN, GaN, SiC, and Yttrium aluminum garnet (YAG), it is first of all not easy to form a groove 61 in the optical waveguide layer 53 by dry etching, e.g. Reactive Ion Etching (RIE), and particularly to dig a deeper groove. When the grooves are arranged at a narrow pitch, deeper grooves would be more difficult to be dug. If the groove is further dug, the angle between the side surface and the bottom surface which defines the groove would be less than 90° e.g. 80° or 75°. That is, it would not be an upwardly-opening rectangular groove in a cross-section, but would be an upwardly-opening V-shaped groove in a cross-section. As the V-shaped groove poses an upper limit to the aspect ratio or the maximum depth of groove, rectangular groove would be preferable in terms of diffraction efficiency.

In some embodiments, the depth of groove in the periodic structure 6 is equal to or greater than 200 nm and/or is equal to or less than 600 nm. In some cases, the depth D of the groove in the periodic structure 6 is equal to or greater than 250 nm or 300 nm. In some cases, the depth D of the groove in the periodic structure 6 is equal to or less than 550 nm or 500 nm.

In some embodiments, the side surfaces 611, 613 of the groove 61 are substantially vertical or slanted at angle nearby 90° relative to the bottom surface 612. In some cases, the angle between the side surfaces 611, 613 and the bottom surface 612 satisfies $\theta \geq 80°$, or $\theta \geq 82°$, or $\theta \geq 84°$, or $\theta \geq 86°$, or $\theta \geq 88°$. In such a case, the diffraction efficiency obtained from given number of grooves is enhanced and, as a result, reduction of number of grooves and downsizing of optical element would be facilitated.

In some cases, $L \leq 100$ μm is satisfied where L indicates an effective length of the periodic structure. In some cases, $4.5$ μm $\leq L \leq 70.5$ μm is satisfied where L indicates an effective length of the periodic structure. In some cases, $5.01$ μm $\leq L \leq 65.25$ μm is satisfied where L indicates an effective length of the periodic structure. In some cases, $5.25$ μm $\leq L \leq 57$ μm is satisfied where L indicates an effective length of the periodic structure.

Effective length L of periodic structure 6 is a length of the groove arranged portion along the groove-arrangement direction D2. If the effective length L is shorter, the length K of the optical element 5 along the groove-arrangement direction D2 can be shorter. Note that, in a case where the periodic structure 6 is divided into two portions by a non-groove-formed portion, the effective length L of the periodic structure 6 is equal to the total length of the divided respective groove-formed portions and does not include the length of the non-groove-formed portion. The effective length L of the periodic structure 6 is less than the length K of the optical element 5 along the groove-arrangement direction D2. In another example, the effective length L of the periodic structure 6 is equal to the length K of the optical element 5 along the groove-arrangement direction D2. In a specific case schematically shown in FIG. 1, the optical element 5 is smaller than the semiconductor laser device 2 in the groove-arrangement direction D2.

In some cases, the number of grooves is equal to or less than 200. Smaller number of grooves indicates shorter effective length L of periodic structure 6, allowing the optical element 5 to be downsized. In some cases, the number of grooves is 30 to 150.

A pair of side grooves 56 is formed which extend in the groove-arrangement direction D2 to sandwich the periodic structure 6, facilitating light confinement in the lateral direction D3 by the optical waveguide layer 53, not necessarily limited to this through. Due to this pair of side grooves 56, a portion of the optical waveguide layer 53 provided with the periodic structure 6 extending in the groove-arrangement direction D2 is shaped like a ridge. In some cases, portions of the optical waveguide layer 53 adjacent in the lateral direction D3 to the ridge portion of the optical waveguide layer 53 are removed.

Hereinafter, a non-limiting exemplary method of producing an optical element 5 will be discussed with reference to FIGS. 5 to 13. Firstly, a bottom clad layer 52 is formed on to a base substrate 51 through sputtering or the like (See FIG. 5). Next, an optical waveguide layer 53 is formed onto the bottom clad layer 52 through sputtering or the like (See FIG. 6). A first mask layer 71 is formed onto the optical waveguide layer 53 through sputtering or the like (See FIG. 7). Next, a second mask layer 72 made of plastic material is formed onto the first mask layer 71 based on a coating method such as a spin coating or the like (See FIG. 8). Next, a mold 73 is prepared (See FIG. 9) and, based on pressing the mold 73 to the second mask layer 72 and irradiating of energy rays, an array of first openings 75*j* is formed in the second mask layer 72 (See FIG. 10). If necessary, a release layer is formed to the pressing surface of the mold 73 so that separation of the mold 73 off the second mask layer 72 is facilitated. In some cases, a film portion of the second mask layer remains at the bottom of the first opening, and the first opening does not completely penetrate through the second mask layer. The remaining film may have a thickness of 5 nm to 100 nm, for example.

The pressing surface of the mold 73 shown in FIG. 9 is provided with a first periodic structure 74 which will finally be transferred to the optical waveguide layer 53. In the first periodic structure 74, elongated walls 74*k* in a first direction are arranged at a constant pitch in the second direction that is orthogonal to the first direction. Each groove 74*j* is formed between adjacent walls 74*k*. The first direction matches the above-described lateral direction D3, and the second direction matches the above-described groove-arrangement direction D2. When the second mask layer 72 is pressed by the mold 73 under a condition where the plastic material of the second mask layer 72 is softened, the wall 74*k* of the mold 73 pushes the plastic material of the second mask layer 72 away, and the plastic material of the second mask layer 72 flows into the grooves 74*j* adjacent to the wall 74*k*. Under this state, an energy ray is irradiated so that the plastic material of the second mask layer 72 is hardened. The energy ray is an ultraviolet ray, but not necessarily limited to this. As such, the first periodic structure 74 is transferred to the second mask layer 72 to form a second periodic structure 75. The second mask layer 72 is provided with first openings 75*j* corresponding to the walls 74*k* of the first periodic structure 74, and provided with first walls 75*k* corresponding to the grooves 74*j* of the first periodic structure 74.

Next, an array of second openings 76*j* is formed in the first mask layer 71 by dry etching through the first openings 75*j* of the second mask layer 72 (See FIG. 11). As such, a first periodic structure 74 is transferred to the first mask layer 71 to form a third periodic structure 76. In the first mask layer 71, a second opening 76*j* is formed directly below the groove 75*j* between the walls 75*k* of the second periodic structure 75, and a second wall 76*k* is formed directly below the wall 75*k* of the second periodic structure 75. The second mask layer 72 is removed simultaneously with or after the dry etching. The dry etching is a reactive ion etching (RIE), as an example.

Next, an array of grooves 61 is formed in the optical waveguide layer 53 by dry etching through the second openings 76*j* of the first mask layer 71 (See FIG. 12). As such, a first periodic structure 74 is transferred to the optical waveguide layer 53 to form the above-described periodic structure 6. In the optical waveguide layer 53, a groove 61 is formed directly below the groove 76*j* between the walls 76*k* of the third periodic structure 76, and a wall 62 is formed directly below the wall 76*k* of the third periodic structure 76. The first mask layer 71 is removed simultaneously with or after the dry etching (See FIG. 13). The dry etching is a reactive ion etching (RIE) for example.

After that, side grooves 56 are formed in the optical waveguide layer 53, and a top clad layer 54 is formed onto the optical waveguide layer 53 by sputtering or the like. Regarding the side grooves 56, a third mask layer made of Ti or the like is formed except for a region where the side grooves 56 are to be formed, and the side grooves 56 are formed by Reactive Ion Etching through openings of the third mask layer. After the top clad layer 54 is formed, the grooves 61 in the optical waveguide layer 53 and the side grooves 56 are filled with material of the top clad layer 54. End faces of the optical element 5 are formed by dicing device. Next, the end face of the optical element 5 is optically polished and an AR coating is formed. The AR coating may have a reflectance of 0.1%, for example. In a case where plural optical elements 5 are produced over one base substrate 51, a laminate body is cut by dicing device so that plural chip-shaped optical elements 5 are obtained.

In some cases, the first mask layer 71 is made of metal or metal silicide. For example, the first mask layer 71 is Ti, Cr, Mo, W, Ta, Si, Ni, Al, V, Fe, Nb, Re, Co, Pd, Pt or alloy thereof. For example, the first mask layer 71 is tungsten silicide, vanadium silicide, iron silicide, niobium silicide, molybdenum silicide, rhenium silicide, chromium silicide, cobalt silicide, nickel silicide, palladium silicide, or platinum silicide. The first mask layer 71 is typically a single layer, but not necessarily limited to this.

The second mask layer 72 is a plastic material commercially available which is usable in a nanoimprinting method (UV-curable nanoimprint resin produced by Daicel Chemical Industries, Toyo Gosei and etc.). Viscosity of plastic material of the second mask layer 72, temperature of mold at the time of transfer of periodic structure and the like would be preferably determined by a skilled person in the art.

A halogen-based first etching gas is used during the dry etching of the first mask layer 71 through the first openings 75j of the second mask layer 72. A halogen-based second etching gas is used during the dry etching of the optical waveguide layer 53 through the second openings 76j of the first mask layer 71. The first etching gas and the second etching gas are the same in some cases, and they are different in other cases. In one case, the first etching gas is chlorine-based, and the second etching gas is fluorine-based. In another case, the first etching gas is fluorine-based, and the second etching gas is chlorine-based.

It has been confirmed that, when the optical waveguide layer 53 is made of $Ta_2O_5$ and the first mask layer 71 is an Al film, a groove 61 with 2.5 or more aspect ratio is formed in the optical waveguide layer 53 having 1.5 µm or more layer thickness. The first etching gas is chlorine-based, and the second etching gas is fluorine-based. The chlorine-based etching gas is $BCl_3$, for example. The fluorine-based etching gas is $CHF_3$, for example. The Al film is etched by the first etching gas, causing a by-product of $AlCl_3$. The optical waveguide layer 53 is etched by the second etching gas, causing a by-product of $TaF_5$. In some cases, the by-product may remain in the groove of the optical element 5.

It has been confirmed that, when the optical waveguide layer 53 is made of $Al_2O_3$ and the first mask layer 71 is a W-film, a groove 61 with 200 nm or more depth is formed in the optical waveguide layer 53 with 1.5 µm or more layer thickness. The first etching gas is fluorine-based, and the second etching gas is chlorine-based. The chlorine-based etching gas is $BCl_3$, for example. The fluorine-based etching gas is $CHF_3$, for example. The W-film is etched by the first etching gas, causing a by-product of $WF_6$. The optical waveguide layer 53 is etched by the second etching gas, causing a by-product of $AlCl_3$.

It has been confirmed that, when the optical waveguide layer 53 is made of $LiTaO_3$ and the first mask layer 71 is Al film, a groove 61 with 2.5 or more aspect ratio is formed in the optical waveguide layer 53 with 1.5 µm or more layer thickness. The first etching gas is chlorine-based, and the second etching gas is fluorine-based. The chlorine-based etching gas is $BCl_3$, for example. The fluorine-based etching gas is $CHF_3$, for example. The Al film is etched by the first etching gas, causing a by-product of $AlCl_3$. The optical waveguide layer 53 is etched by the second etching gas, causing a by-product of $TaF_5$. In some cases, the by-product may remain in the groove of the optical element 5.

It has been confirmed that, when the optical waveguide layer 53 is made of $LiNbO_3$ and the first mask layer 71 is a W-film, a groove 61 with 200 nm or more depth is formed in the optical waveguide layer 53 with 1.5 µm or more layer thickness. The first etching gas is fluorine-based, and the second etching gas is chlorine-based. The chlorine-based etching gas is $BCl_3$, for example. The fluorine-based etching gas is $CHF_3$, for example. The W film is etched by the first etching gas, causing a by-product of $WF_6$. The optical waveguide layer 53 is etched by the second etching gas, causing a by-product of $AlCl_3$.

In cases where the optical waveguide layer 53 is made of AlN, GaN, SiC, or Yttrium aluminum garnet (YAG), material of the first mask layer 71 and types of gasses of the first and second etching gasses are appropriately determined so that grooves 61 with 2.5 or more aspect ratio and/or 200 nm or more depth are formed in the optical waveguide layer 53 with 1.5 µm or more layer thickness.

As would be understood from above descriptions, a method of producing an optical element 5 according to an aspect of the present disclosure may include:

forming a first mask layer onto an optical waveguide layer, the optical waveguide layer having a layer-thickness equal to or greater than 1.5 µm and being made of material selected from a group consisting of $Ta_2O_5$, $Al_2O_3$, $LiNbO_3$, AlN, GaN, SiC, and Yttrium aluminum garnet (YAG);

forming, on to the first mask layer, a second mask layer that is made of plastic material;

forming an arrangement of first openings in the second mask layer based on pressing a mold to the second mask layer and irradiating with an energy ray, the mold including a pressing surface provided with a periodic structure of walls where walls elongated in a first direction are arranged at a constant pitch along a second direction orthogonal to the first direction;

forming an arrangement of second openings in the first mask layer by dry-etching through the first openings in the second mask layer; and forming a periodic structure of grooves in the optical waveguide layer by dry-etching through the second openings in the first mask layer, wherein $(D/0.5\Lambda) \geq 2.5$ is satisfied where D indicates the depth of groove in the periodic structure; and $\Lambda$ indicates the pitch, the unit of $\Lambda$ being identical to the unit of D.

In other words, the mold is configured to satisfy this condition of aspect ratio, and the dry-etching is performed to satisfy this condition of aspect ratio.

As an exemplary set of conditions, the first mask is made of Al; chlorine-based etching gas is used for dry-etching through first openings in the second mask layer; and fluorine-based etching gas is used for dry-etching through second openings in the first mask layer. Detailed conditions are disclosed in a working example 1.

As another set of conditions, the first mask is made of W; fluorine-based etching gas is used for dry-etching through first openings in the second mask layer; and chlorine-based etching gas is used for dry-etching through second openings in the first mask layer. Detailed conditions are disclosed in a working example 2.

As to an optical element with a pitch Λ, the average pitch tolerance in the periodic structure thereof is preferably within ±0.5 nm. An average pitch tolerance should be calculated by the any one of the following methods.

First of all, a DUV light diffraction pitch calibration may be used which can realize calibration with uncertainty of 0.04 nm.

In a working example 1 described below, when the average pitch tolerance of periodic structure was evaluated based on the DUV light diffraction pitch calibration for an optical element with groove depth 500 nm and pitch 185 nm, we confirmed the tolerance of accuracy was within ±0.03 nm.

Determined is a difference between a measurement of pitch Λ and a value calculated by dividing the effective length of periodic structure of optical element by the number of grooves, so that a value of tolerance is determined. Average of this tolerance can be calculated to determine an average pitch tolerance.

WORKING EXAMPLE 1

A bottom clad layer made of SiO$_2$ was formed, by sputtering, onto a Si base substrate to have 1.0 μm thickness. Next, an optical waveguide layer made of Ta$_2$O$_5$ was formed, by spattering, onto the top surface of the bottom clad layer to have 2.0 μm thickness. Next, a first mask layer made of Al was formed, by sputtering, onto the top surface of the optical waveguide layer to have 50 nm thickness. Next, the second mask layer was coated onto the first mask layer to have 80 nm thickness. Next, the second mask layer was pressed by a mold, and plastic material of the second mask layer was hardened by irradiation of ultraviolet ray. Then the mold was removed off and an array of openings was formed in the second mask layer. Next, the first mask layer was dry-etched through openings of the second mask layer by chlorine-based gas (BCl$_3$) such that openings were formed that reach the optical waveguide layer. At the same time of this dry-etching, the second mask layer was removed. Next, the optical waveguide layer was dry-etched with fluorine-based gas (CHF$_3$) for a predetermined time window through openings in the first mask layer, thus grooves with 350 nm depth were formed in the optical waveguide layer 53. The pitch of the arranged grooves Λ was 185 nm. The angle between the side surface and the bottom surface of the groove was about 90°. This was followed by removal of the first mask layer. FIG. 14 shows a SEM image of one sample according to this working example (Magnification 100,000×). The aspect ratio was about 3.8. In the working example 1, upwardly opening rectangular grooves were obtained.

Next, side grooves were formed that have a width of 2 μm and a depth of 1.6 μm in the optical waveguide layer, so that the optical waveguide layer 53 was shaped like a ridge. Next, the top clad layer made of SiO$_2$ and having a thickness of 0.5 μm was formed, by sputtering. Then, the laminate body was cut into a bar-shape by a dicing device, and the both end faces formed by the cutting were optically polished. Thereafter, AR coatings with 0.1% reflectance were formed onto the respective end faces. The bar-shaped laminate body was cut so that chip-like optical elements were obtained. The optical element had a size of 1 mm width and 500 μm length.

In the working example 1, produced and evaluated for their optical characteristics were some samples where the effective length of periodic structure of optical waveguide layer, in other words, the number of grooves 61 were varied. For the purpose of evaluation, a super luminescence diode (SLD), which is a wide frequency band light source, was used. An emitted light from the SLD was input to the optical element, and an output light from the optical element was analyzed by an optical spectrum analyzer. Reflection characteristics was evaluated form transparency characteristics of the optical element. For one given wavelength, here 800 μm, reflectance of optical element was measured. The chart 1 below shows the result.

CHART 1

| Effective length of periodic structure of optical waveguide layer (μm) | Reflectance (%) |
| --- | --- |
| 10 | 31 |
| 20 | 73 |
| 30 | 91 |
| 40 | 97 |
| 50 | 99 |
| 60 | 100 |
| 70 | 100 |
| 80 | 100 |
| 90 | 100 |
| 100 | 100 |

It is understandable that, in order to achieve roughly 40% reflectance of the optical element, roughly 13 μm of the effective length of periodic structure of optical waveguide layer is sufficient. It is confirmed that the effective length of the periodic structure 6 was greatly reduced, and the reduction in size of optical element was facilitated greatly.

MODIFIED EXAMPLES OF WORKING EXAMPLE 1

Time window for etching the optical waveguide layer through openings in the first mask layer was reduced than the corresponding time window in the working example 1, and it was confirmed that the resulting aspect ratio was equal to 2.5 and the angle between the side surface and the bottom surface of the groove was substantially 90°. Time window for etching the optical waveguide layer through openings of the first mask layer was increased than the corresponding time window in the working example 1, and it was confirmed that the resulting aspect ratio was equal to 5.7 and the angle between the side surface and the bottom surface of the groove was substantially 90°.

WORKING EXAMPLE 2

The working example 2 differs from the working example 1 in the followings: the pitch of groove Λ to be formed in the optical waveguide layer 53 was 239 nm; Al$_2$O$_3$ was used for the optical waveguide layer; W was used for the first mask layer; fluorine-based etching gas (CHF$_3$) was used as a gas for etching a first mask layer through openings in the second mask layer; and chlorine-based etching gas (BCl$_3$) was used as a gas for etching an optical waveguide layer through openings in the first mask layer. Similar to the working example 1, the layer thickness of the optical waveguide layer was 2.0 μm. The pitch of groove Λ in the optical waveguide layer was 239 nm, and the depth of groove was 300 nm, and the angle between the side surface and the bottom surface of the groove was 80°. The aspect ratio was about 2.5. In a case of working example 2, upwardly opening rectangular grooves were obtained which is inferior but equivalent to that of the working example 1. In working example 2 either as in the working example 1, produced and evaluated for their optical characteristics were some samples where the effective length of periodic structure of optical waveguide layer, in other words, the number of grooves 61 were varied.

CHART 2

| Effective length of periodic structure of optical waveguide layer (μm) | Reflectance (%) |
| --- | --- |
| 10 | 2 |
| 20 | 7 |
| 30 | 16 |
| 40 | 26 |
| 50 | 37 |
| 60 | 48 |
| 70 | 57 |
| 80 | 66 |
| 90 | 73 |
| 100 | 79 |

In a case of working example 2, it is understandable that, in order to achieve roughly 40% reflectance of the optical element, the periodic structure of optical waveguide layer is required to have the effective length of roughly 55 μm.

In the case of working example 2, aspect ratio >2.5 and, even compared with comparative example 1, it is confirmed that effective length of periodic structure of optical waveguide layer is advantageously reduced, similar to working example 1.

WORKING EXAMPLE 3

A bottom clad layer made of $SiO_2$ was formed, by sputtering, onto a Si base substrate to have 1.0 μm thickness. Next, an optical waveguide layer made of $LiTaO_3$ was formed, by spattering, onto the top surface of the bottom clad layer to have 2.0 μm thickness. Next, a first mask layer made of Al was formed, by sputtering, onto the top surface of the optical waveguide layer to have 50 nm thickness. Next, the second mask layer was coated onto the first mask layer to have 80 nm thickness. Next, the second mask layer was pressed by a mold, and plastic material of the second mask layer was hardened by irradiation of ultraviolet ray. Then, the mold was removed off and an array of openings was formed in the second mask layer. Next, the first mask layer was dry-etched through openings of the second mask layer by chlorine-based gas ($BCl_3$) such that openings were formed that reach the optical waveguide layer. At the same time of this dry-etching, the second mask layer was removed. Next, the optical waveguide layer was dry-etched with fluorine-based gas ($CHF_3$) for a predetermined time window through openings in the first mask layer, thus grooves having depth of 290 nm were formed in the optical waveguide layer 53. The pitch Λ of the arranged grooves was 185 nm. The angle between the side surface and the bottom surface of the groove was about 90°. This was followed by removal of the first mask layer. The aspect ratio was about 3.1. In the working example 3, upwardly opening rectangular grooves were obtained.

WORKING EXAMPLE 4

A bottom clad layer made of $SiO_2$ was formed, by sputtering, onto a Si base substrate to have 1.0 μm thickness. Next, an optical waveguide layer made of $LiNbO_3$ was formed, by spattering, onto the top surface of the bottom clad layer to have 2.0 μm thickness. Next, a first mask layer made of Al was formed, by sputtering, onto the top surface of the optical waveguide layer to have 50 nm thickness. Next, the second mask layer was coated onto the first mask layer to have 80 nm thickness. Next, the second mask layer was pressed by a mold, and plastic material of the second mask layer was hardened by irradiation of ultraviolet ray. Then, the mold was removed off and an array of openings was formed in the second mask layer. Next, the first mask layer was dry-etched through openings in the second mask layer by chlorine-based gas ($BCl_3$) such that openings were formed that reach the optical waveguide layer. At the same time of this dry-etching, the second mask layer was removed. Next, the optical waveguide layer was dry-etched with fluorine-based gas ($CHF_3$) for a predetermined time window through openings in the first mask layer, thus grooves having depth of 260 nm were formed in the optical waveguide layer 53. The pitch Λ of the arranged grooves was 185 nm. The angle between the side surface and the bottom surface of the groove was about 90°. This was followed by removal of the first mask layer. The aspect ratio was about 2.8. In the working example 4, upwardly opening rectangular grooves were obtained.

COMPARATIVE EXAMPLE 1

In the comparative example 1, unlike the working example 1, Ti was used as a first mask layer, and fluorine-based gas ($CHF_3$) was used as a gas for etching the first mask layer through the openings in the second mask layer. A thickness of the optical waveguide layer was 2.0 μm, and this is the same as in the working example 1. Similar to the working example 1, fluorine-based gas ($CHF_3$) was used as a gas for etching the optical waveguide layer through the openings of the first mask layer. The pitch Λ of the arranged grooves in the optical waveguide layer was 185 nm; the depth of groove was 150 nm; and the angle between the side surface and the bottom surface of the groove was 75°. The aspect ratio was about 1.6. A SEM image of one sample according to this comparative example is shown in FIG. 15 (Magnification 100,000×). In the case of comparative example 1, the upwardly opening rectangular grooves as in the working example 1 were not obtained, and upwardly opening V-shaped grooves were formed. In comparative example 1, produced and evaluated for their optical characteristics were some samples where the effective length of periodic structure of optical waveguide layer, in other words, the number of grooves 61 were varied (See Chart 3).

CHART 3

| Effective length of periodic structure of optical waveguide layer (μm) | reflectance (%) |
| --- | --- |
| 30 | 3 |
| 60 | 10 |
| 90 | 20 |
| 120 | 32 |
| 150 | 44 |
| 180 | 56 |
| 210 | 65 |
| 240 | 74 |
| 270 | 80 |
| 300 | 85 |

In the case of comparative example 1, it is understandable that the periodic structure is required to have the Effective length of about 140 µm in order to allow an optical element to have a reflectance about 40%.

COMPARATIVE EXAMPLE 2

In the comparative example 2, unlike the working example 2, Ti was used as a first mask layer. Similar to the working example 2, the pitch Λ of the arranged grooves to be formed in the optical waveguide layer 53 was 239 nm. Similar to the working example 2, fluorine-based gas ($CHF_3$) was used as a gas for etching the first mask layer through openings of second mask layer, and chlorine-based gas ($BCl_3$) was used as a gas for etching the optical waveguide layer through openings of first mask layer. A thickness of the optical waveguide layer was 2.0 µm, and this is the same as in the working example 2. The depth of groove was 190 nm; and the angle between the side surface and the bottom surface of the groove was 60°. The aspect ratio was about 1.6. In the case of comparative example 2, the upwardly opening rectangular grooves as in the working example 2 were not obtained, and upwardly opening V-shaped grooves were formed. In comparative example 2, some samples having, as variation, effective length of periodic structure of optical waveguide layer i.e. the number of grooves 61 were produced and evaluated for their optical characteristics as in the working example 2 (See Chart 4).

CHART 4

| Effective length of periodic structure of optical waveguide layer (µm) | Reflectance (%) |
|---|---|
| 30 | 3 |
| 60 | 10 |
| 90 | 20 |
| 120 | 32 |
| 150 | 44 |
| 180 | 56 |
| 210 | 65 |
| 240 | 74 |
| 270 | 80 |
| 300 | 85 |

In the case of comparative example 2, it is understandable that the periodic structure is required to have the effective length of about 140 µm in order to allow an optical element to have a reflectance about 40%.

Based on the above teaching, a skilled person in the art would be able to add various modifications to the respective embodiments. Reference numerals in Claims are just for reference and should not be referred for the purpose of narrowly construing the scope of claims.

The invention claimed is:

1. An optical element comprising an optical waveguide layer, the optical waveguide layer including a periodic structure of grooves,
   wherein the optical waveguide layer has a layer-thickness equal to or greater than 1.5 µm and is made of a material selected from a group consisting of $Ta_2O_5$, $Al_2O_3$, $LiNbO_3$, $LiTaO_3$, AlN, GaN, SiC, and Yttrium aluminum garnet (YAG), and wherein
   $(D/0.5\Lambda) \geq 2.5$ is satisfied
   where D indicates a depth of the grooves in the periodic structure of grooves,
   Λ indicates a pitch of the grooves in the periodic structure of grooves, and the units of D and Λ are the same,
   wherein $L \leq 100$ µm is satisfied where L indicates an effective length of the periodic structure of grooves, and
   wherein a reflectance of the optical element is greater than 20%.

2. The optical element of claim 1, wherein the pitch Λ of the arranged grooves in the periodic structure of grooves is equal to or greater than 150 nm.

3. The optical element of claim 1, wherein the pitch Λ of the grooves in the periodic structure of grooves is equal to or less than 480 nm.

4. The optical element of claim 1, wherein the pitch Λ of the grooves in the periodic structure of grooves is in the range from 150 nm to 470 nm.

5. The optical element of claim 1, wherein the pitch Λ of the grooves in the periodic structure of grooves is in the range from 167 nm to 435 nm.

6. The optical element of claim 1, wherein the pitch Λ of the grooves in the periodic structure of grooves is in the range from 175 nm to 380 nm.

7. The optical element of claim 1, wherein the depth D of the grooves in the periodic structure of grooves is equal to or greater than 200 nm.

8. The optical element of claim 1, wherein the depth D of the grooves in the periodic structure of grooves is equal to or greater than 250 nm.

9. The optical element of claim 1, wherein the depth D of the grooves in the periodic structure of grooves is equal to or greater than 300 nm.

10. The optical element of claim 1, wherein the depth D of the grooves in the periodic structure of grooves is equal to or less than 600 nm.

11. The optical element of claim 1, wherein the depth D of the grooves in the periodic structure of grooves is equal to or less than 550 nm.

12. The optical element of claim 1, wherein the depth D of the grooves in the periodic structure of grooves is equal to or less than 500 nm.

13. The optical element of claim 1, wherein $4.5 \mu m \leq L \leq 70.5 \mu m$ is satisfied where L indicates an effective length of the periodic structure of grooves.

14. The optical element of claim 1, wherein $5.01 \mu m \leq L \leq 65.25 \mu m$ is satisfied where L indicates an effective length of the periodic structure of grooves.

15. The optical element of claim 1, wherein $5.25 \mu m \leq L \leq 57 \mu m$ is satisfied where L indicates an effective length of the periodic structure of grooves.

16. The optical element of claim 1, wherein the number of grooves in the periodic structure of grooves is equal to or less than 200.

17. The optical element of claim 1, wherein each groove in the periodic structure of grooves is defined by a pair of side surfaces opposed in parallel and a bottom surface arranged between the side surfaces.

18. The optical element of claim 17, wherein $\theta \geq 80°$, or $\theta \geq 82°$, or $\theta \geq 84°$, or $\theta \geq 86°$, or $\theta \geq 88°$ is satisfied where θ indicates an angle between the bottom surface and the side surface of each groove in the periodic structure of grooves.

19. The optical element of claim 1, wherein average pitch tolerance of the grooves in the periodic structure of grooves is within ±0.5 nm.

20. The optical element of claim 1, wherein the optical waveguide layer comprises a ridge-shaped portion provided with the periodic structure of grooves extending along the groove arrangement direction in the periodic structure of grooves.

21. A laser assembly comprising:
   an optical element of claim 1; and
   a laser element including an active layer optically coupled with the optical waveguide layer of the optical element.

22. The optical element of claim 1, wherein the reflectance of the optical element is equal to or greater than 40%.

23. A method of producing an optical element, the method comprising:
   forming a first mask layer onto an optical waveguide layer, the optical waveguide layer having a layer-thickness equal to or greater than 1.5 μm and being made of a material selected from a group consisting of $Ta_2O_5$, $Al_2O_3$, $LiNbO_3$, $LiTaO_3$, AlN, GaN, SiC, and Yttrium aluminum garnet (YAG);
   forming, on to the first mask layer, a second mask layer that is made of a plastic material;
   forming an arrangement of first openings in the second mask layer based on pressing a mold to the second mask layer and irradiating with an energy ray, the mold including a pressing surface provided with a periodic structure of walls where walls elongated in a first direction are arranged at a constant pitch along a second direction orthogonal to the first direction;
   forming an arrangement of second openings in the first mask layer by dry-etching through the first openings in the second mask layer; and
   forming a periodic structure of grooves in the optical waveguide layer by dry-etching through the second openings in the first mask layer, wherein
   $(D/0.5\Lambda) \geq 2.5$ is satisfied
   where
   D indicates a depth of the grooves in the periodic structure of grooves; and
   $\Lambda$ indicates a pitch of the grooves in the periodic structure of grooves, and the units of D and $\Lambda$ are the same,
   wherein $L \leq 100$ μm is satisfied where L indicates an effective length of the periodic structure of grooves, and
   wherein a reflectance of the optical element is greater than 20%.

24. The method of producing an optical element of claim 23, wherein each groove in the periodic structure of grooves is defined by a pair of side surfaces opposed in parallel and a bottom surface arranged between the side surfaces, and wherein
   $\theta \geq 80°$, or $\theta \geq 82°$, or $\theta \geq 84°$, or $\theta \geq 86°$, or $\theta \geq 88°$ is satisfied where $\theta$ indicates an angle between the bottom surface and the side surface of the groove.

25. The method of producing an optical element of claim 23, wherein average pitch tolerance of the grooves in the periodic structure of grooves is within ±0.5 nm.

26. The method of producing an optical element of claim 23, wherein the reflectance of the optical element is equal to or greater than 40%.

* * * * *